US010325718B2

(12) United States Patent
Jang et al.

(10) Patent No.: US 10,325,718 B2
(45) Date of Patent: Jun. 18, 2019

(54) METHOD AND SYSTEM FOR LAYOUT OPTIMIZATION OF SECONDARY COIL FOR WIRELESS POWER TRANSFER

(71) Applicant: Korea Advanced Institute of Science and Technology, Daejeon (KR)

(72) Inventors: In Gwun Jang, Daejeon (KR); Seung Beop Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 371 days.

(21) Appl. No.: 15/043,131

(22) Filed: Feb. 12, 2016

(65) Prior Publication Data
US 2016/0379753 A1 Dec. 29, 2016

(30) Foreign Application Priority Data

Jun. 29, 2015 (KR) .................. 10-2015-0092192
Aug. 13, 2015 (KR) .................. 10-2015-0114891

(51) Int. Cl.
*H01F 38/14* (2006.01)
*G06F 17/50* (2006.01)
*H02J 50/12* (2016.01)

(52) U.S. Cl.
CPC ......... *H01F 38/14* (2013.01); *G06F 17/5063* (2013.01); *H02J 50/12* (2016.02)

(58) Field of Classification Search
CPC ...... H01F 5/003; H01F 27/2804; H01F 38/14; H02J 5/005; B60L 11/182; H04B 5/0037; G01S 5/14
See application file for complete search history.

(56) References Cited

U.S. PATENT DOCUMENTS

| 7,825,543 | B2* | 11/2010 | Karalis | B60L 11/182 |
| | | | | 307/104 |
| 9,306,635 | B2* | 4/2016 | Kurs | H04B 5/0037 |
| 9,318,898 | B2* | 4/2016 | John | H02J 5/005 |
| 9,842,687 | B2* | 12/2017 | Kurs | H01F 38/14 |

(Continued)

OTHER PUBLICATIONS

Lee et al., "Layout optimization of the secondary coils for wireless power transfer systems," submitted to the IEEE Wireless Power Transfer Conference 2015, University of Colorado, Boulder, Colorado, May 13, 2015.

(Continued)

*Primary Examiner* — Kandasamy Thangavelu
(74) *Attorney, Agent, or Firm* — Marshall, Gerstein & Borun LLP

(57) ABSTRACT

Disclosed is a method for optimizing a layout of a secondary coil for a wireless power transfer. The method includes reconstructing a secondary coil based on a fixed grid, corresponding to a design domain, to set a relative turn of each fixed grid and obtaining at least one or more of an electromagnetic measure and a physical measure of the secondary coil to optimize a layout of the secondary coil; applying an effective turn to the optimized layout of the secondary coil to perform post-processing; and deriving a layout of a physical coil about the secondary coil. The effective turn corresponds to a difference between the relative turns existing at a same position.

15 Claims, 17 Drawing Sheets

(56) References Cited

U.S. PATENT DOCUMENTS

| | | | | |
|---|---|---|---|---|
| 2007/0145830 A1* | 6/2007 | Lee | ............... | H02J 5/005 307/135 |
| 2009/0096413 A1* | 4/2009 | Partovi | ............... | H01F 5/003 320/108 |
| 2011/0285210 A1* | 11/2011 | Lemmens | ............... | H02J 5/005 307/104 |
| 2012/0007787 A1* | 1/2012 | Schantz | ............... | G01S 5/14 343/788 |
| 2013/0069445 A1* | 3/2013 | Waffenschmidt | ... | H01F 27/2804 307/104 |
| 2013/0214591 A1* | 8/2013 | Miller | ............... | H02J 5/005 307/9.1 |
| 2016/0094051 A1* | 3/2016 | Soar | ............... | H02J 5/005 307/9.1 |
| 2016/0181819 A1* | 6/2016 | Kautz | ............... | H02J 5/005 320/108 |
| 2016/0284459 A1* | 9/2016 | Ishigaki | ............... | H01F 38/14 |

OTHER PUBLICATIONS

Lee et al., "Layout optimization of the secondary coils for wireless power transfer systems," presented at the IEEE Wireless Power Transfer Conference 2015, University of Colorado, Boulder, Colorado, May 13, 2015.

Lee et al., "Layout optimization of the secondary coils for wireless power transfer systems," submitted to the 11th World Congress on Structural and Multidisciplinary Optimisation, Sydney, Australia, Jun. 11, 2015.

Lee et al., "Layout optimization of the secondary coils for wireless power transfer systems," presented at the 11th World Congress on Structural and Multidisciplinary Optimisation, Sydney, Australia, Jun. 11, 2015.

Dufresne, "Coil Design and Inductance Calculator," retrieved from the Internet at: <<https://rimstar.org/science electronics projects/ coil design inductance.htm>> (2011).

* cited by examiner

Original representation → Fixed grid-based representation

Fixed grid-based
coil representation

Fixed grid-based
coil representation

| Design constants | Values |
|---|---|
| Size of the primary coil [$W_1$] | 20 (mm) |
| Size of the design domain for the secondary coil [$W_2$] | 160 (mm) |
| Size of each fixed grid [$W_3$] | 3.2 (mm) |
| Distance between two source coils ($G_2$) | 20 (mm) |
| Turns of the primary coil | 30 |
| Resonance frequency | 100 (kHz) |
| Current in the source coils | 0.7 (A) |

FIG. 10C

| Air gap | 10 mm | 15 mm | 40 mm |
| --- | --- | --- | --- |
| Iterations | 48 | 59 | 49 |
| Function calls | 104 | 126 | 108 |
| Calculation time (Hr) | 3.43 | 4.15 | 3.56 |

Experiment setting

| Air-gap (mm) | $V_{pp}$ (V) | | | Mass (g) | | |
|---|---|---|---|---|---|---|
| | Nu* | Ex** | Error (%) | Nu | Ex | Error (%) |
| 10 | 4.37 | 5.01 | 12.77 | 2.92 | 2.58 | 13.17 |
| 40 | 0.89 | 0.82 | 8.53 | 2.78 | 2.43 | 14.40 |

*Nu: numerical simulation, **Ex: experiment

Optimized layout → Effective turns

METHOD AND SYSTEM FOR LAYOUT OPTIMIZATION OF SECONDARY COIL FOR WIRELESS POWER TRANSFER

CROSS-REFERENCE TO RELATED APPLICATIONS

A claim for priority under 35 U.S.C. § 119 is made to Korean Patent Application Nos. 10-2015-0092192 filed Jun. 29, 2015, and 10-2015-0114891 filed Aug. 13, 2015, in the Korean Intellectual Property Office, the entire contents of which are hereby incorporated by reference.

BACKGROUND

Most of the subject matter of the invention described in the present application was publicly disclosed by the inventors In Gwun Jang and Seung Beop Lee in a paper and a presentation entitled "Layout optimization of the secondary coils for wireless power transfer systems," submitted to and presented at the IEEE Wireless Power Transfer Conference 2015, held at the University of Colorado, Boulder, Colo., USA, on May 13, 2015; and in a paper and a presentation entitled "Layout optimization of the secondary coils for wireless power transfer systems," submitted to and presented at the $11^{th}$ World Congress of Structural and Multidisciplinary Optimization, held in Sydney, Australia, on Jun. 11, 2015. Therefore, the publication or disclosure was made by and/or originated from all members of the inventive entity of the present invention less than one year before the filing date of the present application. A copy of the article is provided in a concurrently filed Information Disclosure Statement pursuant to the guidance of 78 Fed. Reg. 11076 (Feb. 14, 2013).

Embodiments of the inventive concept relate to a method and a system capable of optimizing a layout of a secondary coil for a wireless power transfer.

Wireless power transfer may refer to a contactless power transfer technique in which electrical energy from a primary coil (a transmitter part) induces magnetic field energy and the induced magnetic energy induces electrical energy at a secondary coil (a receiver part). The wireless power transfer is being actively researched and is applied to a variety of applications ranging from electronics to electric vehicles.

There is a growing interest in a wireless power transfer system, which uses a plurality of transmission coils to improve efficiency of the wireless power transfer and guarantee stability thereof, and a wireless power transfer system which use a plurality of receiving coils to charge multiple devices at the same time. Accordingly, many consumers demand a function to charge multiple portable electronic devices rapidly at the same time.

To satisfy the performance of the wireless power transfer about multiple devices, an efficient transfer of the magnetic energy should be secured through the selection of optimal layouts about primary and secondary coils.

A coil layout for a conventional wireless power transfer system may be designed mostly depending on experience and intuition of the designer. This manner is not fit to a coil layout design method for an up-to-date wireless power transfer system which includes a plurality of transceiver systems and should satisfy various constraints (e.g., a transfer capacity, a transfer efficiency, a system mass, a criteria about health hazards, etc.).

For this reason, to implement a wireless power transfer function (multi-source and multi-device based wireless power transfer) being required recently newly, there is required a systematic and efficient coil layout design method which is distinguished from a conventional design method.

The improvement of efficiency of the wireless power transfer system being actively researched may depend on a magnetic resonance manner which is based on the adjustment of inductance, capacitance, and an input frequency.

For the magnetic resonance manner, a change in inductance due to misalignment between primary and secondary coils and an environmental change (e.g., a temperature, etc.) may cause a change in a resonant frequency (e.g., mismatch between an input frequency and a system frequency), thereby lowering the efficiency of system sharply (instability).

With regard to the improvement of the efficiency of the wireless power transfer system and the achievement of the stability thereof, the following approaches have been used to design layouts for primary and secondary coils which are able to generate and maintain a constant magnetic field (e.g., a coupling coefficient and a self-inductance).

With the empirical design approaches, the study is being conducted in the direction of analyzing influence according to the result of arbitrarily changing coil shape and phase, turns, measure, etc.

A conventional technique associated with a change in the coil shape and phase, turns, and measure is disclosed, but since the empirical design approaches depend on the knowledge and intuition of a designer, a more systematic and more effective design methodology is required.

With the design domain search, the study is being conducted to figure out and improve the performance of system through the full design domain search about one or more of a plurality of design variables.

A full design domain search technique about mutual inductance, characteristic impedance, internal resistance, and a resonant frequency has been disclosed. The design domain search is more systematic in design than the empirical design approaches but is inefficient in computation.

As such, the empirical design approaches and the design domain search do not satisfy various constraints (e.g., a transfer capacity, a transfer efficiency, mass, a criteria about health hazards, etc.) For the wireless power transfer system which includes a plurality of transceiver systems and in which a lot of design variables exist, it is impossible to consider all mutual coupling effects.

SUMMARY

Embodiments of the inventive concept are directed to provide fixed grid-based coil representation and effective turns for a wireless power transfer system to optimize a layout of a secondary coil for the wireless power transfer system.

Embodiments of the inventive concept provide secondary coil layout optimization method and system capable of determining an optimal secondary coil which satisfies all constraints (e.g., a mass, transfer capacity and efficiency, a criteria of health hazards, etc.) which a wireless power transfer system requires and optimizes a given performance value (e.g., an induced value, a mass, etc.).

One aspect of embodiments of the inventive concept is directed to provide a method for optimizing a layout of a secondary coil for a wireless power transfer. The method may include reconstructing a secondary coil based on a fixed grid, corresponding to a design domain, to set a relative turn of each fixed grid and obtaining at least one or more of an electromagnetic measure (a transfer efficiency, a transfer capacity, an induced voltage, an electromagnetic field (EMF), etc.) and a physical measure (a mass, a volume, a size, etc.) of the secondary coil to optimize a layout of the secondary coil; applying an effective turn to the optimized layout of the secondary coil to perform post-processing; and deriving a layout of a physical coil about the secondary coil. The electromagnetic measure may include at least one or more of a transfer efficiency, a transfer capacity, an induced voltage, and an electromagnetic field, and the physical measure may include at least one or more of a mass, a volume, and a size of the secondary coil. The effective turn may correspond to a difference between the relative turns existing at a same position.

The method may further include obtaining an objective function for minimizing or maximizing at least one or more of the electromagnetic measure (a transfer efficiency, a transfer capacity, an induced voltage, an electromagnetic field (EMF), etc.) and the physical measure (a mass, a volume, a size, etc.) of the secondary coil.

The method may further include obtaining a constraint including at least one or more of an upper limit and a lower limit of the electromagnetic and physical measures of the secondary coil.

The optimizing of the layout of the secondary coil may include forming the fixed grid corresponding to the design domain, obtaining physical coil turns by reconstructing the secondary coil based on the fixed grids and setting the relative turn of each fixed grid, and obtaining the electromagnetic measure and the physical measure of the secondary coil to optimize the layout of the secondary coil.

The optimizing of the layout of the secondary coil may include optimizing the layout of the secondary coil by calculating the physical measure of secondary coil through the effective turn and calculating the electromagnetic measure of the secondary coil through Maxwell equations (Biot-Savart's law, Faraday's law, etc.).

The applying of the effective turn to the optimized layout of the secondary coil to perform the post-processing may include applying the effective turn to the optimized layout of the secondary coil to calculate the physical measure of the secondary coil, and applying the effective turn to the optimized layout of the secondary coil to evaluate the electromagnetic measure of the secondary coil.

The applying of the effective turn to the optimized layout of the secondary coil to perform the post-processing may include calculating smooth boundary representation to minimize a difference between fixed grid-based coil representation and physical coil implementation.

The deriving may include post-processing the secondary coil composed of the fixed grid so as to have a coil having a smooth boundary, and calculating a physical characteristic value and an electromagnetic characteristic value of the secondary coil expressed with the smooth boundary.

Another aspect of embodiments of the inventive concept is directed to provide a system for optimizing a layout of a secondary coil for a wireless power transfer. The system may include an optimization module and an analysis module. The optimization module may reconstruct a secondary coil based on a fixed grid, corresponding to a design domain, to set a relative turn of each fixed grid and may obtain at least one or more of an electromagnetic measure (a transfer efficiency, a transfer capacity, an induced voltage, an electromagnetic field (EMF), etc.) and a physical measure (a mass, a volume, a size, etc.) of the secondary coil to optimize a layout of the secondary coil. The analysis module may apply an effective turn, corresponding to a difference between relative turns existing at a same position, to the optimized layout of the secondary coil to perform post-processing. The electromagnetic measure may include at least one or more of a transfer efficiency, a transfer capacity, an induced voltage, and an electromagnetic field, and the physical measure may include at least one or more of a mass, a volume, and a size of the secondary coil. The optimization module may derive a layout of a physical layout about the secondary coil by analyzing at least one or more of the electromagnetic measure and the physical measure of the secondary coil based on a result of the post-processing received from the analysis module.

The optimization module may include an object function which sets unit obtaining an objective function for minimizing or maximizing at least one or more of the electromagnetic measure and the physical measure of the secondary coil.

The optimization module may include a constraint setting unit which obtains a constraint including at least one or more of an upper limit and a lower limit of the electromagnetic and physical measures of the secondary coil.

The optimization module may include a fixed grid generation unit which forms the fixed grid corresponding to the design domain, a relative turn setting unit which obtains physical coil turns by reconstructing the secondary coil based on the fixed grids and sets the relative turn of each fixed grid, and a layout unit which obtains the electromagnetic measure and the physical measure of the secondary coil to optimize the layout of the secondary coil.

The optimization module may optimize the layout of the secondary coil by calculating the physical measure of secondary coil through the effective turn and calculating the electromagnetic measure of the secondary coil through Maxwell equations.

The analysis module may include a physical measure evaluation unit which applies the effective turn to the optimized layout of the secondary coil to calculate the physical measure of the secondary coil, and an electromagnetic measure evaluation unit which applies the effective turn to the optimized layout of the secondary coil to evaluate the electromagnetic measure of the secondary coil.

The electromagnetic measure evaluation unit may represent an equivalent closed loop based on the post-processing to calculate the electromagnetic measure.

BRIEF DESCRIPTION OF THE FIGURES

The above and other objects and features will become apparent from the following description with reference to the following figures, wherein like reference numerals refer to like parts throughout the various figures unless otherwise specified, and wherein

FIGS. 10A to 10D are diagrams illustrating an optimization history according to an embodiment of the inventive concept;

DETAILED DESCRIPTION

Figure 1:
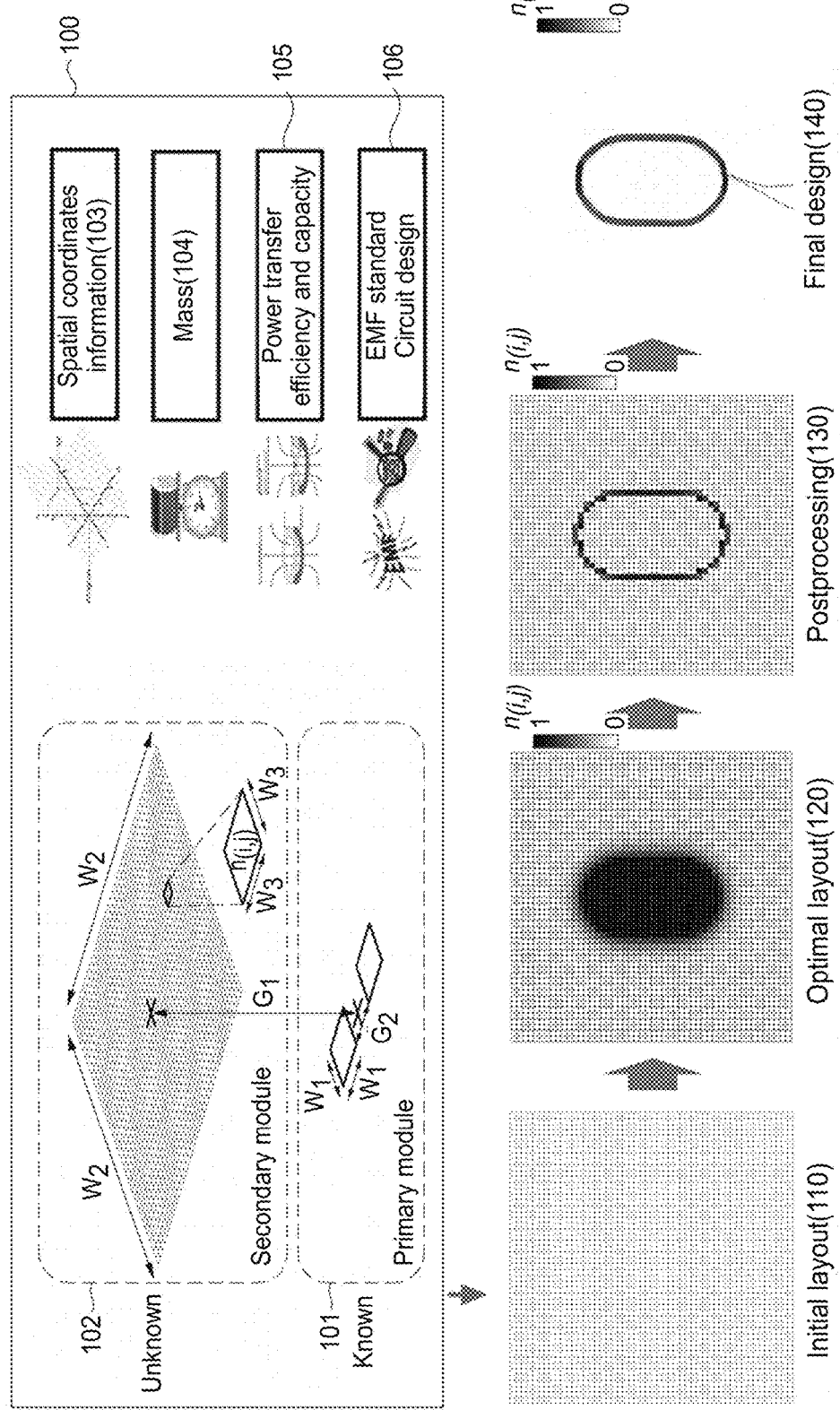
FIG. 1 is a diagram illustrating layout optimization of a secondary coil for a wireless power transfer according to an embodiment of the inventive concept.

Below, embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. In the drawings, embodiments of the inventive concept are not limited to the specific examples provided herein and are exaggerated for clarity.

Embodiments of the inventive concept may provide fixed grid-based representation and effective turns for layout optimization of secondary coils of a wireless power transfer system, thereby maximizing the performance of the wireless power transfer system.

In addition, as optimization is applied to a wireless power transfer system, it may be possible to minimize or maximize an objective function (e.g., a mass, a transfer efficiency, etc.) while satisfying various constraints (e.g., a transfer efficiency, a transfer capacity, a criteria of health hazards, structure information of a coil and ferrite, etc.). Thus, the performance of the wireless power transfer system may be maximized under a given condition.

FIG. 1 is a diagram illustrating layout optimization of a secondary coil for a wireless power transfer according to an embodiment of the inventive concept.

Referring to FIG. 1, wireless power transfer may refer to a contactless power transfer technique in which electrical energy from a primary coil (e.g., a transmitter part) induces magnetic field energy and the induced magnetic energy induces electrical energy at a secondary coil (e.g., a receiver part). To satisfy the performance of the wireless power transfer about multiple devices, an efficient transfer of the magnetic energy should be secured through the selection of optimal layouts about primary and secondary coils.

According to an embodiment, a layout of a secondary coil for a wireless power transfer may be optimized under the condition that a layout about a primary coil is previously determined and a layout about a secondary coil is not determined.

In step 100, a system for layout optimization of a secondary coil for a wireless power transfer (hereinafter referred to as "optimization system") may provide initial design variable information. For example, the initial design variable information may include a primary coil 101, an air-gap, spatial coordinates information 103, a coil mass 104, power transfer efficiency and capacity 105, electromagnetic field (EMF) circuit information 106, etc. Here, the air-gap may refer to a space between the primary coil 101 and the secondary coil 102.

The optimization system may make it possible to set a relative turn of each fixed-grid on a design domain and to set a design variable.

In addition, the optimization system may set an objective function and constraints. For example, it may be possible to set the objective function such as the maximization of an induced voltage of the secondary coil or the minimization of the mass of the secondary coil. For another example, it may be possible to set constraints such as an upper limit of the mass of the secondary coil and a lower limit of an induced voltage of the secondary coil or the retention of a rated voltage, an upper limit of the intensity of a magnetic field (e.g., health hazards), etc.

In step S110, the optimization system may create a fixed grid of which the shape and size are the same as those of the whole design domain.

In step S120, the optimization system may represent a coil on the fixed grid, and thus the optimization system may layout an optimized coil through the fixed grid-based coil representation.

In step 130, the optimization system may obtain a layout of an equivalent closed loop by applying effective turns to a derived optimized layout. That is, as the inside of the derived optimized layer is removed by the effective turn, it may be possible to obtain an equivalent closed loop in which only an outer loop remains.

In step 140, the optimization system may secure a design plan about the secondary coil through the equivalent closed loop and may implement a shape wound with a coil finally.

Thus, there may be implemented a shape of the secondary coil capable of receiving an energy optimally.

As such, there may be provided the optimization system, capable of determining an optimal secondary coil which satisfies all constraints (e.g., a mass, a transfer capacity and efficiency, a criteria of health hazards, etc.) which a wireless power transfer system requires and optimizes a given objective function (e.g., an induced value, a mass, etc.), and a method thereof.

Below, the fixed grid-based coil representation will be described in detail.

Figure 2:
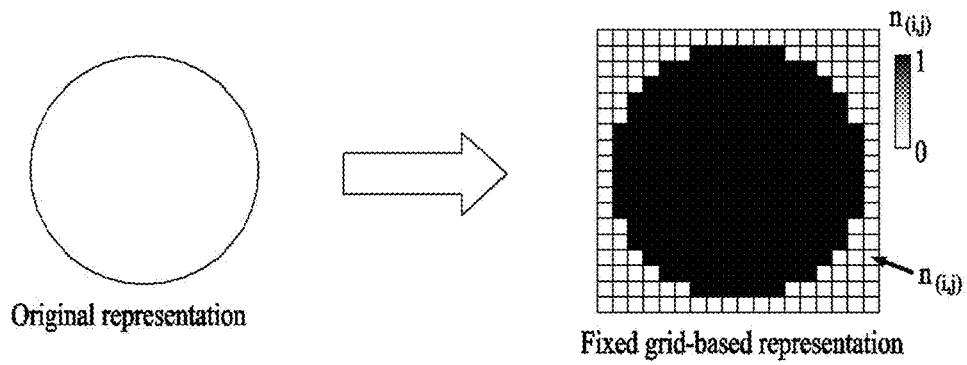
FIG. 2 is a diagram illustrating fixed grid-based coil representation according to an embodiment of the inventive concept.

FIG. 2 is a diagram illustrating fixed grid-based coil representation according to an embodiment of the inventive concept.

To optimize a coil layout, the whole design domain may be divided into fixed grids which have the same shape and size. As illustrated in FIG. 2, a shape of a physical coil may be reconstructed based on fixed grids.

In the case where the size of a fixed grid is set to be sufficiently small, it may be possible to reconstruct even any coil layout (e.g., a shape, a size, etc.) based on a fixed grid.

For the fixed grid-based coil representation, the following design variables may be set.

A physical coil turn of each fixed grid N(i, j) may be expressed in terms of a relative turn with a penalization, as follows:

$$N_{(i,j)} = n_{(i,j)}^{\gamma} N_0 \quad \text{[Equation 1]}$$

where $N_{(i,j)}$ is a physical coil turn of the fixed grid at (i, j), where i and j represent the numerical order of the grid along the x- and y- axis respectively; $n_{(i,j)}$ is a relative turn (i.e. $0 < n_{min} \le n(i, j) \le 1$) which is a design variable in the proposed layout optimization; $N_0$ is a reference turn; $\gamma$ is a penalty exponent greater than 1.

A line segment expressing the fixed grid may be used as a basic component module associated with Maxwell equations (e.g., the Biot-Savart's law, the Faraday's law, etc.).

Figure 3:
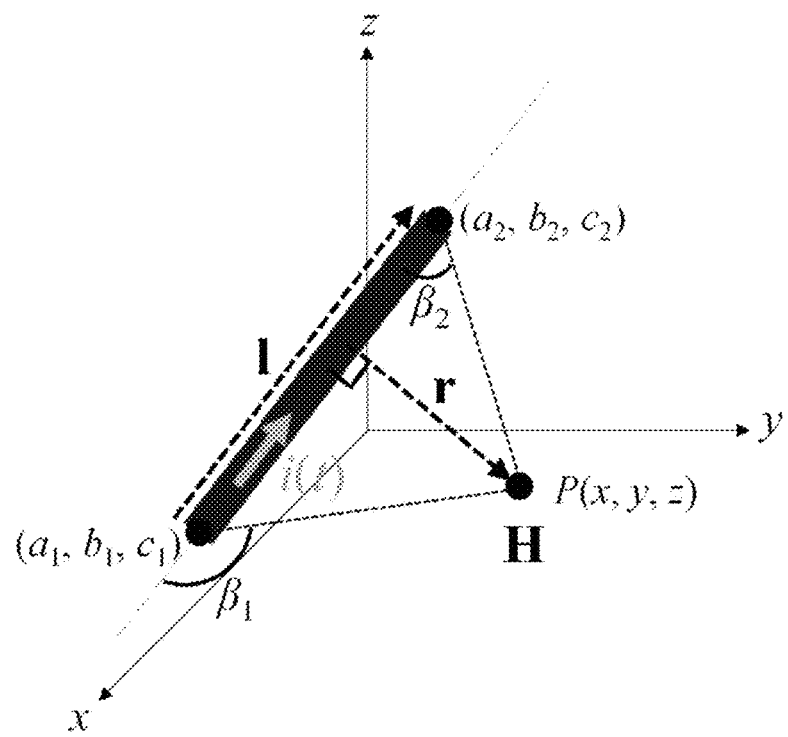
FIG. 3 is a diagram for describing a line segment according to an embodiment of the inventive concept.

FIG. 3 is a diagram for describing a line segment according to an embodiment of the inventive concept.

Referring to FIG. 1, the wireless power transfer system consists of primary and secondary modules. As the first step toward the layout optimization, the primary coil is assumed to be decomposed into straight conductors, considering that any arbitrarily shaped coil can be approximated as a set of straight line segments. For example, a fixed grid may be composed of a plurality of line segments, and a description will be given using a line segment representing such a fixed grid. In order to derive the magnetic field strength at the field point, P(x,y,z), which is induced from a single line segment, three unit vectors are introduced in the cylindrical coordinate along the line segment, as follows:

$$e_l = \frac{l}{|l|} \quad \text{[Equation 2]}$$

$$e_r = \frac{r}{|r|}$$

$$e_\theta = e_l \times e_r$$

where $l=(a_2-a_1)e_x+(b_2-b_1)e_y+(c_2-c_1)e_z$, $(a_i, b_i, c_i)$ denotes the coordinate of an end point of a line segment, $r=(x-a_1+\alpha a_1-\alpha a_2)e_x+(y-b_1+\alpha b_1-\alpha b_2)e_y+(z-c_1+\alpha c_1-\alpha c_2)e_z$ where $$\alpha = \frac{(x-a_1)(a_2-a_1)+(y-b_1)(b_2-b_1)+(z-c_1)(c_2-c_1)}{(a_2-a_1)^2+(b_2-b_1)^2+(c_2-c_1)^2},$$

$e_l$ and $e_r$ are unit vectors along l and r, respectively, and $e_\theta$ is a unit vector along the tangential direction of a circular path that is centered on a line segment and passes the field point.

Then, according to Biot-Savart's law, the magnetic field strength at the field point induced from the ith line segment can be derived as follows:

$$H^i(x, y, z, t) = \frac{I_{peak}\sin \omega t}{4\pi r}(\cos\beta_1 - \cos\beta_2)e_\theta \quad \text{[Equation 3]}$$

$$\text{Where } \cos\beta_h = \frac{(x-a_h)(a_2-a_1)+}{\sqrt{(y-b_h)(b_2-b_1)+(z-c_h)(c_2-c_1)}}{\sqrt{(a_2-a_1)^2+(b_2-b_1)^2+(c_2-c_1)^2}}{\sqrt{(x-a_h)^2+(y-b_h)^2+(z-c_h)^2}}$$

(h=1, 2), $I_{peak}$ is the peak current, and $\omega$ is the angular frequency of the current.

Using the superposition principle, the total magnetic field strength that is induced by an entire primary coil is the total magnetic field caused by all line segments may be expressed, as follows:

$$H^{total}(x, y, z, t) = \sum_{i=1}^{segment} H^i(x, y, z, t) \quad \text{[Equation 4]}$$

Figure 4:
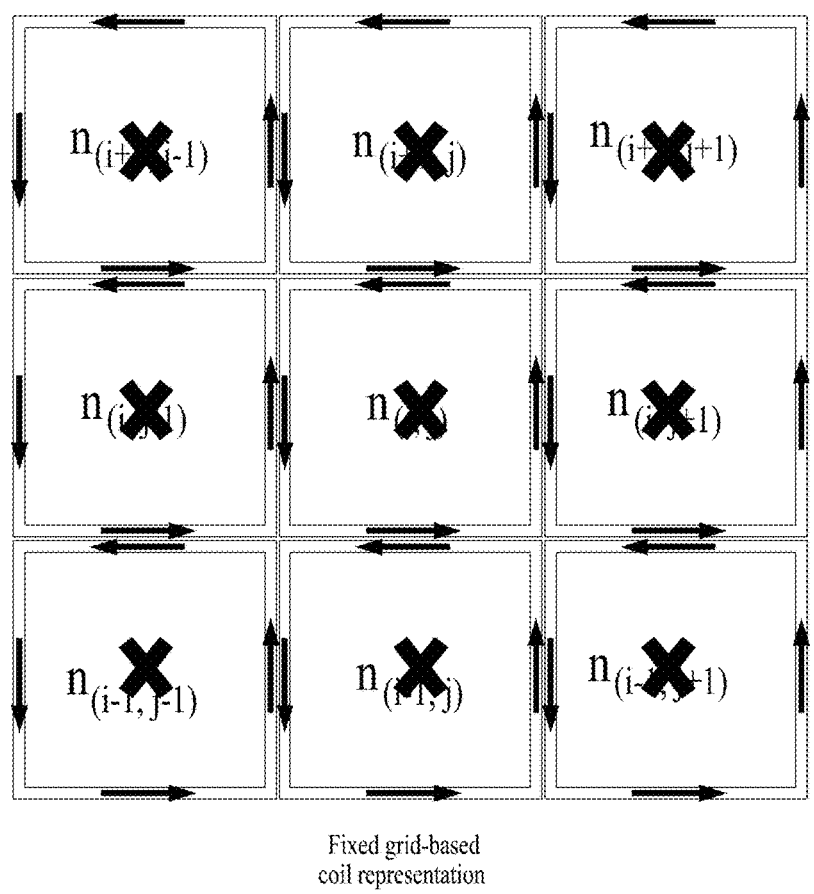
FIG. 4 is a diagram for describing fixed grid-based coil representation according to an embodiment of the inventive concept.

FIG. 4 is a diagram for describing fixed grid-based coil representation according to an embodiment of the inventive concept.

Referring to FIG. 4, the fixed grid-based coil representation may be described using the Faraday's law. Using the fixed grid based coil representation, the Faraday's law may determine the induced voltage in each grid, as follows:

$$e_{(i,j)}(t) = -N_{(i,j)}\frac{d\left(\int_A \mu_0 H^{total}(x, y, z, t) \cdot ds\right)}{dt} \quad \text{[Equation 5]}$$

where A is the area of the fixed grid, $\mu_0$ is the permeability of free space, and ds is a surface vector for the infinitesimal area.

Since the design domain is finely discretized, the magnetic field in each grid may be considered to be uniform. For example, since a magnetic field difference between a center point and a periphery of each fixed grid is not great, the area may be multiplied by a magnetic field of the center point. Thus, the induced voltage may be expressed, as follows:

$$e_{(i,j)}(t) \cong -\mu_0 A N_{(i,j)} \frac{dH^{total}_{(i,j)}(t)}{dt} \quad \text{[Equation 6]}$$

The total induced voltage may be the summation of the induced voltage at each fixed grid, as follows:

$$e_{total}(t) = \sum_i \sum_j e_{(i,j)}(t) \quad \text{[Equation 7]}$$

Below, the effective turns will be described in detail.

Figure 5:
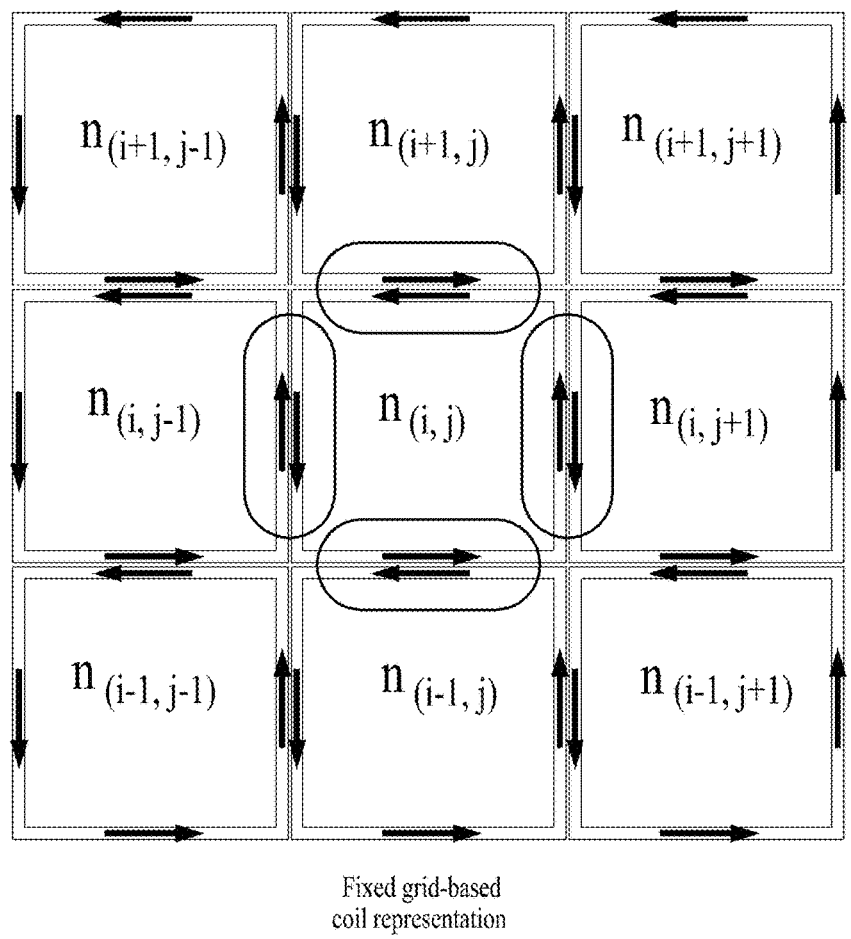
FIG. 5 is a diagram for describing coil mass based on effective turns, according to an embodiment of the inventive concept.

FIG. 5 is a diagram for describing coil mass based on effective turns, according to an embodiment of the inventive concept.

Referring to FIG. 5, in the case where two line segments with opposite directions at the same position exist, a relative turn difference may substantially affect the determination of a coil mass, a magnetic field, etc. That is, in the case where two line segments with opposite directions at the same position exist, currents may be canceled out in terms of the effect. Here, the effective turns may represent a relative turn difference at the same position.

The mass of the equivalent closed loop and an induced voltage may be calculated using the effective turns.

The effective coil mass of the grid at (i, j) may be defined in terms of effective turns, as follows:

$$n^{eff}_{(i,j)} = \frac{1}{2}\{|n_{(i,j)} - n_{(i,j-1)}| + |n_{(i,j)} - n_{(i,j+1)}| + |n_{(i,j)} - n_{(i-1,j)}| + |n_{(i,j)} - n_{(i+1,j)}|\} \quad \text{[Equation 8]}$$

Using effective turns $(n_{(i,j)}^{eff})$, the coil mass at (i, j) $(m_{(i,j)}^{eff})$ can be expressed as follows:

$$m_{(i,j)}^{eff} = \rho l N_0 \sum_{k=1}^{4} n_{(i,j)}^{eff} \quad \text{[Equation 9]}$$

where ρ denotes the line density of coil and l is the side length of the fixed grid.

Figure 6:
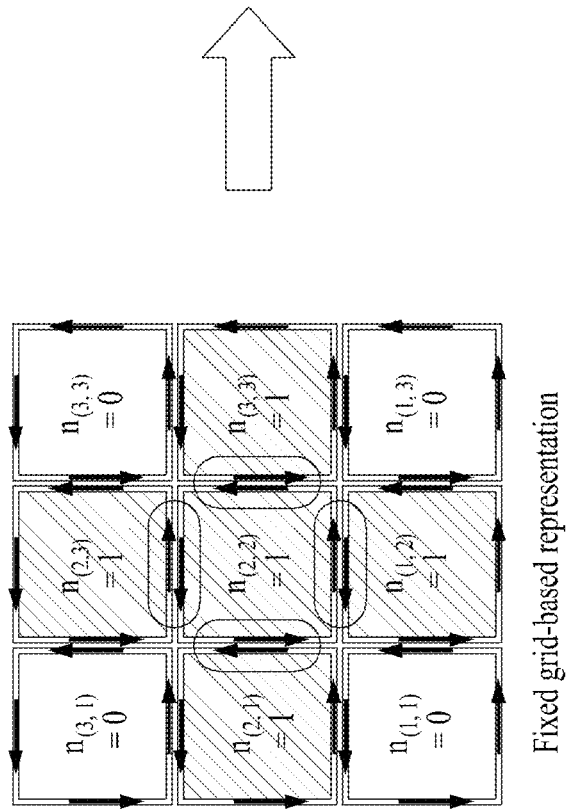
FIG. 6 is a diagram illustrating an equivalent closed loop using effective turns, according to an embodiment of the inventive concept.
Figure 6:
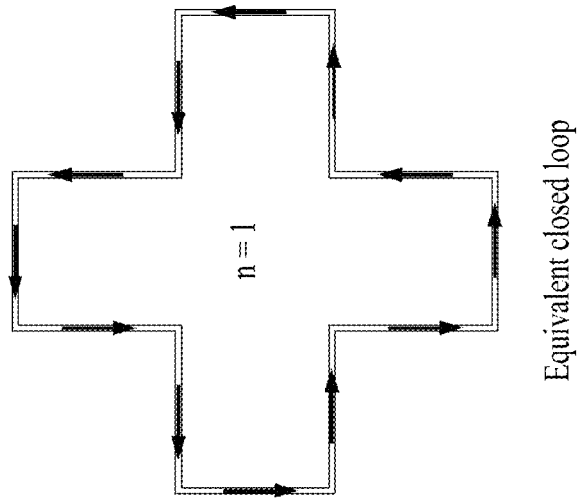

FIG. 6 is a diagram illustrating an equivalent closed loop using effective turns, according to an embodiment of the inventive concept.

Referring to FIG. 6, it may be possible to represent an equivalent closed loop using effective turns. As described above, in the case where two line segments with opposite directions at the same position exist, a relative turn difference may substantially affect the determination of a coil mass, a magnetic field, etc. An equivalent induced voltage may be calculated using the effective turns.

An induced voltage in the fixed grid-based coil representation may be expressed, as follows:

$$e_{total}^{FG}(t) = \quad \text{[Equation 10]}$$

$$-\sum_{i=1}^{3}\sum_{j=1}^{3}\left(N_{(i,j)}\frac{d\left(\int_{A_{(i,j)}}\mu_0 H^{total}(x,y,z,t)\cdot ds\right)}{dt}\right) =$$

$$-N_0\frac{d\left(\int_{A_{equi}}\mu_0 H^{total}(x,y,z,t)\cdot ds\right)}{dt} = e_{total}^{equi}(t)$$

where, $A_{equi}$ denotes the surface area enclosed by an equivalent loop.

As such, an equivalent closed loop in which only an outer loop remains may be represented based on the effective turns.

Figure 7:
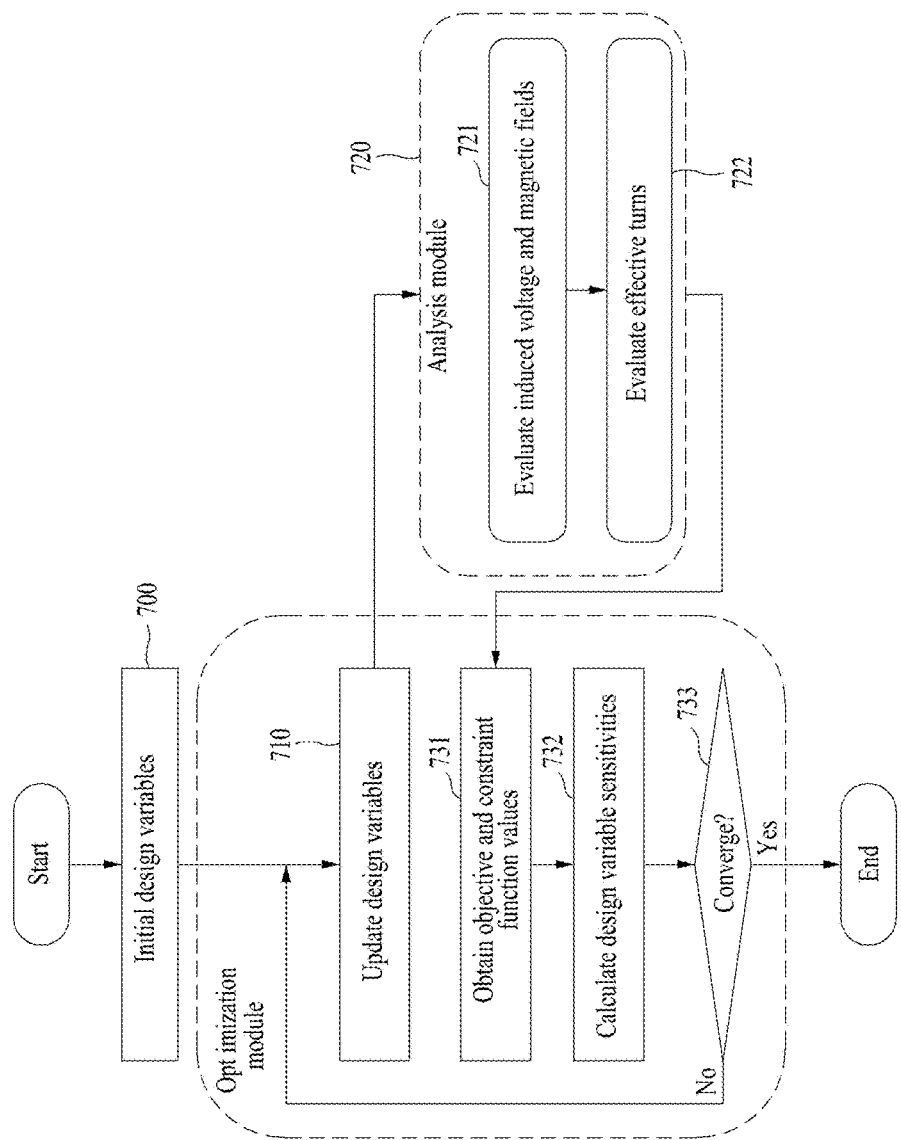
FIG. 7 is a flow chart illustrating a method for layout optimization of a secondary coil for a wireless power transfer, according to an embodiment of the inventive concept.

FIG. 7 is a flow chart illustrating a method for layout optimization of a secondary coil for a wireless power transfer, according to an embodiment of the inventive concept.

The optimization system may be used to design a layout of a secondary coil optimally. The optimization system may include an optimization module and an analysis module.

In step 710, the optimization module may reconstruct a secondary coil based on a fixed grid corresponding a design domain and may set a relative turn of each fixed grid. A secondary coil layout may be optimized by obtaining at least one or more of electromagnetic field-related measures (hereinafter referred to as "electromagnetic measures") and coil-related measures (hereinafter referred to as "physical measures"). Here, the electromagnetic measures may include at least one or more of a transfer efficiency, a transfer capacity, an induced voltage, and an EMF of the secondary coil, and the physical measures may include at least one or more of a mass, a volume, and a size of the secondary coil.

Information about initial design variables may be provided before the optimization of a layout of the secondary coil (700).

Below, a method in which the optimization module optimizes a layout of the secondary coil will be described in detail. First of all, the optimization module may form a fixed grid corresponding to a design domain. The optimization module may reconstruct the secondary coil on the fixed grids based on the fixed grid. Here, the optimization module may set a relative turn of each fixed grid and may obtain physical coil turns. Thus, the optimization module may obtain the mass and induced voltage of the secondary coil to optimize the layout of the secondary coil.

For example, the optimization module may calculate the physical measures (e.g., a mass, a volume, a size, etc.) of the secondary coil through the effective turns. In addition, the optimization module may calculate the electromagnetic measures (e.g., a transfer efficiency, a transfer capacity, an induced voltage, an EMF, etc.) of the secondary coil through the Maxwell functions (the Biot-Savart's law, the Faraday's law, etc.), thereby optimizing the layout of the secondary coil. Here, the Biot-Savart's law and the Faraday's law may refer to a method for calculating the electromagnetic measures. However, the scope and spirit of the inventive concept may not be limited thereto.

In step 720, the analysis module may perform post-processing by applying the effective turn corresponding to a difference between relative turns existing at the same position, to the optimized layout of the secondary coil.

In detail, in step 721, the analysis module may evaluate at least one or more of physical measures including a mass, a volume, a size, etc. of the secondary coil, by applying the effective turn to the optimized layout of the secondary coil. In step 722, the analysis module may evaluate at least one or more of the electromagnetic measures including a transfer efficiency, a transfer capacity, an induced voltage, an EMF, etc. of the secondary coil, by applying the effective turns to the optimized layout of the secondary coil.

The analysis module may calculate smooth boundary representation to minimize an error between the fixed grid-based coil representation and the physical coil implementation.

The analysis module may represent an equivalent closed loop based on the post-processing and may calculate equivalent electromagnetic measures (e.g., a magnetic field strength).

To perform the post-processing based on the effective turns and the smooth boundary representation, the analysis module may represent the equivalent closed loop based on the effective turns and the smooth boundary representation and may calculate an equivalent induced voltage, and thus the analysis module may analyze the induced voltage.

The analysis result of the analysis module may be sent to the optimization module to calculate next objective and constraint functions and corresponding sensitivities.

The optimization module and the analysis module may exchange data with each other, and thus a layout of a physical coil about the secondary coil may be derived. In other words, the optimization module may calculate the objective function and constraints based on information evaluated by the analysis module (731) and may calculate corresponding sensitivities (732). The analytic sensitivities of the electromagnetic measures (e.g., a transfer efficiency, a transfer capacity, an induced voltage, an EMF, etc.) and the physical measures (e.g., a volume, a mass, a size, etc.) may make it possible to obtain higher computational efficiency.

The deriving of the layout of the physical coil may include post-processing the secondary coil composed of fixed grids to a coil having a smooth boundary based on the effective turns and calculating physical measures and electromagnetic measures of the secondary coil. Here, the physical measures may include a mass, a volume, a size, etc. of the secondary coil, and the electromagnetic measures may include a transfer efficiency, a transfer capacity, an induced voltage, an EMF, etc. of the secondary coil.

Meanwhile, the optimization module may set an objective function and constraints. For example, the objective function may be set to include at least one or more of the maximization of an induced voltage in the secondary coil and the minimization of mass of the secondary coil. For another example, the constraints may be set to include at least one or more of an upper limit of the mass of the secondary coil and a lower limit of the induced voltage of the secondary coil.

If the result of analyzing the objective function and design variables is within a predetermined value, the optimization process may terminate (733). For example, if the relative changes in the objective function and design variables between two consecutive iterations are less than 0.001 and 0.0001 respectively, the optimization process may terminate.

Otherwise, the optimization module may update the design variables and may repeat the aforementioned procedure. At the end of optimization, the optimized layout of the secondary coils may be determined.

With the above description, the optimization module may obtain the mass and induced voltage of the secondary coil to optimize the layout of the secondary coil, and the analysis module may evaluate the mass and induced voltage of the secondary coil. Thus, it may be possible to derive a layout of a physical coil about the secondary coil more accurately.

According to an embodiment of the inventive concept, it may be possible to provide the optimization method, capable of determining an optimal secondary coil which satisfies all constraints (e.g., a mass, a transfer capacity, a transfer efficiency, a criteria of health hazards, etc.) required by the wireless power transfer system and optimizes given objective functions (e.g., a transfer efficiency, an induced voltage, a mass, etc.).

Below, the optimization system will be described in detail.

Figure 8:
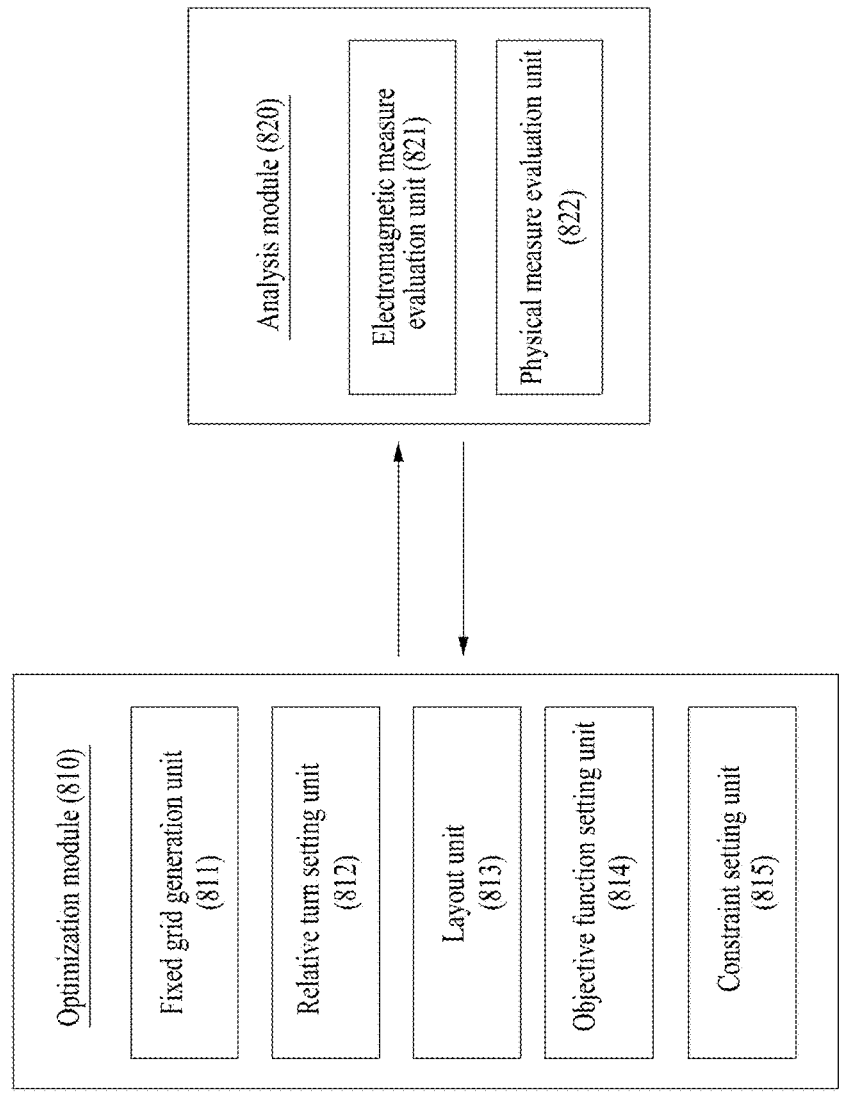
FIG. 8 is a block diagram illustrating an optimization system according to an embodiment of the inventive concept.

FIG. 8 is a block diagram illustrating an optimization system according to an embodiment of the inventive concept. A system for optimizing a layout of a secondary coil for a wireless power transfer, that is, the optimization system may be implemented through the optimization method described with reference to FIG. 7.

Referring to FIG. 8, the optimization system may include an optimization module 810 and an analysis module 820.

The optimization module 810 may reconstruct a secondary coil based on a fixed grid corresponding to a design domain and may set a relative turn of each fixed grid; the optimization module 810 may obtain at least one or more of the mass and induced voltage of the secondary coil and may optimize a layout of the secondary coil.

The optimization module 810 may include a fixed grid generation unit 811, a relative turn setting unit 812, and a layout unit 813.

The fixed grid generation unit 811 may form a fixed grid corresponding to a design domain.

The relative turn setting unit 812 may reconstruct the secondary coil based on the fixed grid, may set a relative turn of each fixed grid, and may obtain physical coil turns.

The layout unit 813 may obtain the mass and induced voltage of the secondary coil and may optimize the layout of the secondary coil.

In addition, the optimization module 810 may calculate the mass of the secondary coil through the effective turns. The optimization module 810 may calculate the induced voltage of the secondary coil through the Maxwell equations (the Biot-Savart's law, the Faraday's law, etc.) and may optimize the layout of the secondary coil based on the calculation result.

The optimization module 810 may derive a layout of a physical coil about the secondary coil by analyzing at least one or more of electromagnetic measures, including the induced voltage, and physical measures, including the mass of the secondary coil, based on the post-processing result from the analysis module 820.

That is, based on information evaluated by the analysis module 820, the optimization module 810 may obtain an objective function and constraints and may calculate corresponding sensitivities. The analytic sensitivities about a transfer efficiency, a transfer capacity, an induced voltage, an EMF, etc. and may make it possible to obtain higher computational efficiency.

For example, an objective function setting unit 814 of the optimization module 810 may set the objective function so as to include at least one or more of the maximization of an induced voltage in the secondary coil and the minimization of mass of the secondary coil.

The optimization module 810 may include a constraint setting unit 815 which obtains constraints including at least one or more of an upper limit and a lower limit of electromagnetic and physical measures of the secondary coil. For example, the constraint setting unit 815 of the optimization module 810 may set constraints including at least one or more of an upper limit of the mass of the secondary coil and a lower limit of the induced voltage of the secondary coil.

If the result of analyzing the objective function and design variables is within a predetermined value, the optimization module 810 may terminate the optimization process. For example, if the relative changes in the objective function and design variables between two consecutive iterations are less than 0.001 and 0.0001 respectively, the optimization process may terminate.

Otherwise, the optimization module 810 may update the design variables and may repeat the procedure. At the end of optimization, the optimized layout of the secondary coils may be determined.

The analysis module 820 may perform post-processing by applying the effective turn corresponding to a difference between relative turns existing at the same position, to the optimized layout of the secondary coil. For example, the analysis module 820 may optimize evaluation and system by identifying a point where an induced voltage is saturated, through a graph.

In detail, the analysis module 820 may be composed of an electromagnetic measure evaluation unit 821 and a physical measure evaluation unit 822.

The electromagnetic measure evaluation unit 821 may evaluate at least one or more of a transfer capacity, a transfer efficiency, an induced voltage, and an EMF by applying the effective turns to the optimized layout of the secondary coil.

The electromagnetic measure evaluation unit 821 may represent the equivalent closed loop based on the post-processing and may calculate electromagnetic measures. In addition, the electromagnetic measure evaluation unit 821 may not be limited to evaluate at least one or more of a transfer capacity, a transfer efficiency, an induced voltage, and an EMF.

The physical measured value evaluation unit 822 may evaluate a physical measured value, such as the effective mass of the secondary coil, by applying the effective turns to the optimized layout of the secondary coil.

For example, the analysis module 820 may set a limit value of an electromagnetic wave at a specific position to intercept the electromagnetic wave at the specific position.

As such, the optimization module 810 and the analysis module 820 may exchange data with each other, thereby deriving an optimized layout of the secondary coil. In addition, a layout of a physical coil about the secondary coil may be derived through the post-processing of the layout of the secondary coil.

Figure 9:
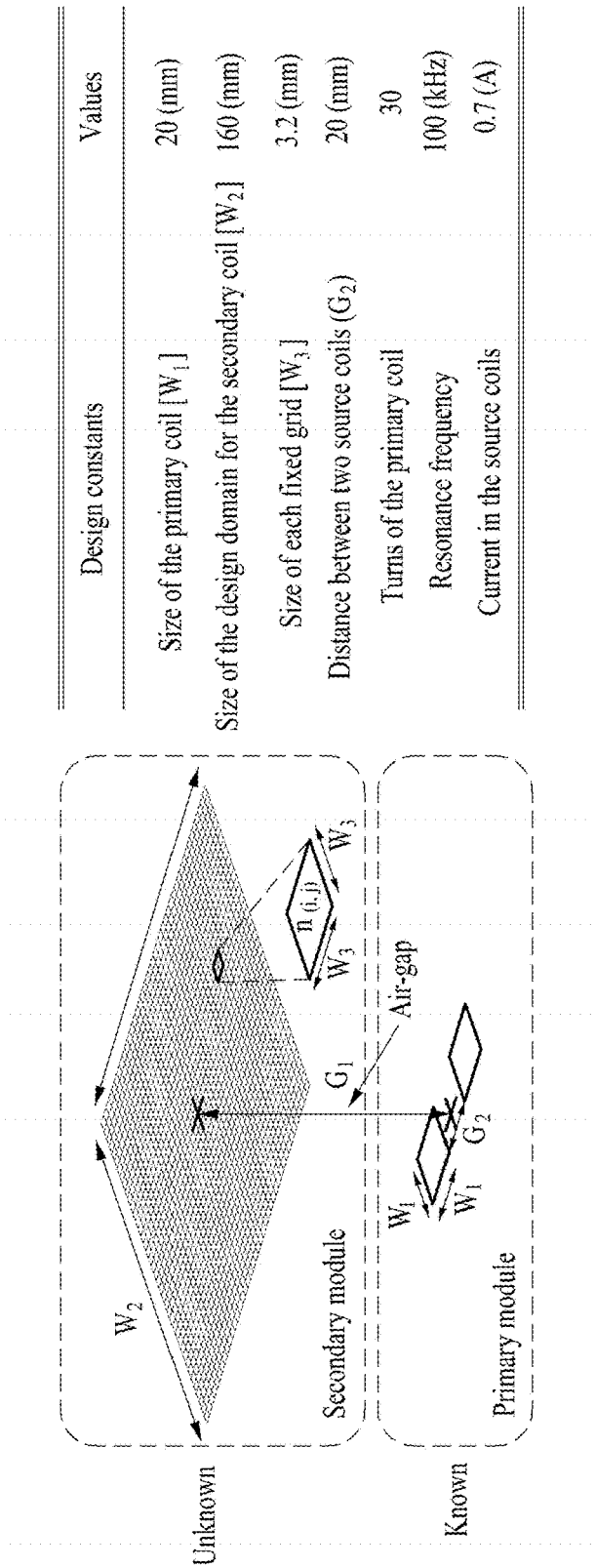
FIG. 9 is a diagram illustrating an application of an optimized layout of a secondary coil, according to an embodiment of the inventive concept.

FIG. 9 is a diagram illustrating an application of an optimized layout of a secondary coil, according to an embodiment of the inventive concept.

An application of an optimized layout of a secondary coil may be illustrated in FIG. 9, and information of a primary coil may be previously determined. In this case, initial design variable information may be provided to optimize a layout of the secondary coil. For example, the initial design variable information may include information about the size and turns of the primary coil, a resonant frequency, a design domain of the secondary coil, etc.

FIGS. 10A to 10D are diagrams illustrating an optimization history according to an embodiment of the inventive concept.

Referring to FIGS. 10A to 10D, a design plan for secondary coil layout optimization may be derived with respect to three air-gaps under the same optimization design formulation.

Figure 10A:
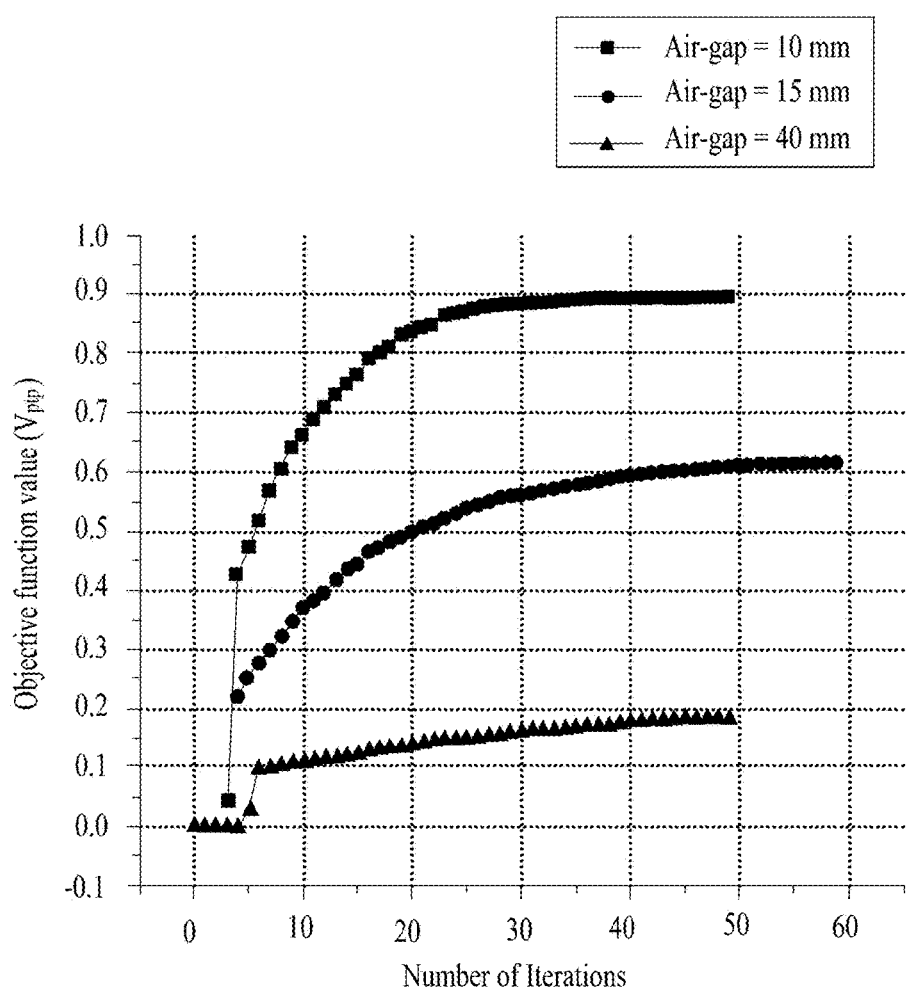
Figure 10B:
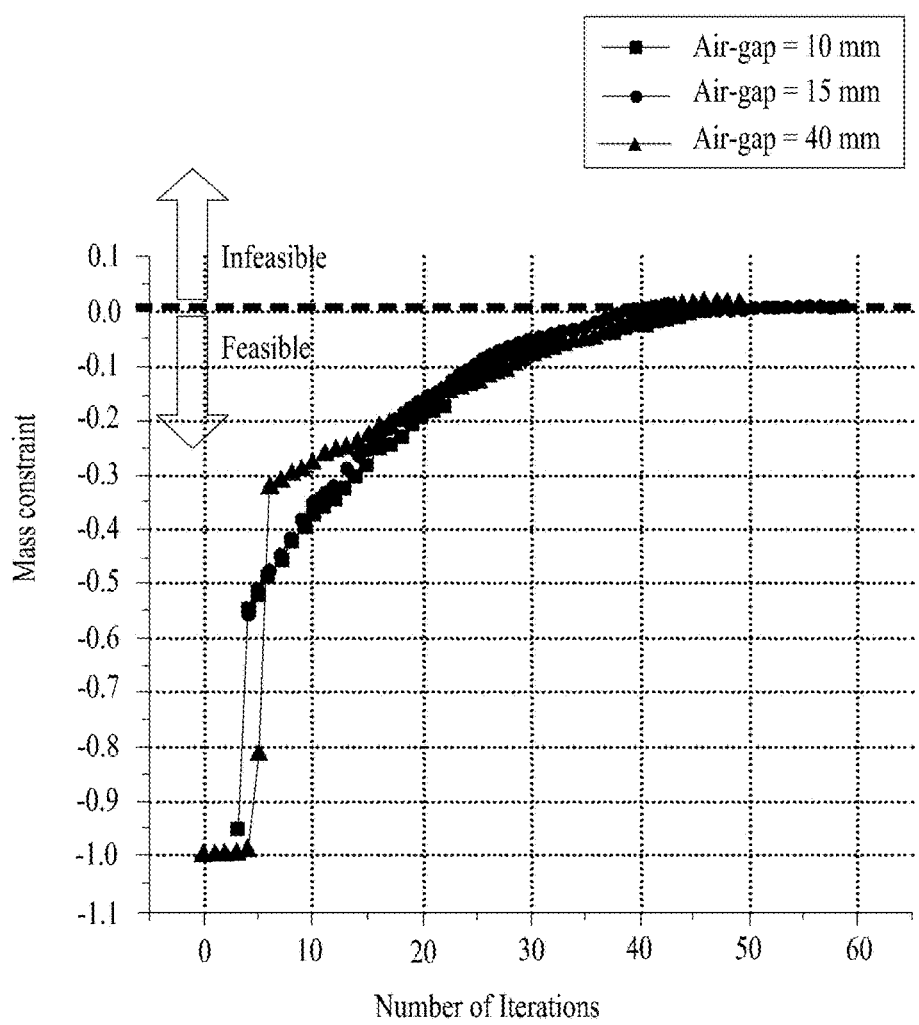

Referring to FIG. 10A, a design plan for secondary coil layout optimization may be derived by comparing object function values according to iterations under three air-gap conditions. Referring to FIG. 10B, a design plan for secondary coil layout optimization may be derived by comparing mass constraints according to iterations under three air-gap conditions. Here, the mass constraint may have a negative value.

Figure 10D:
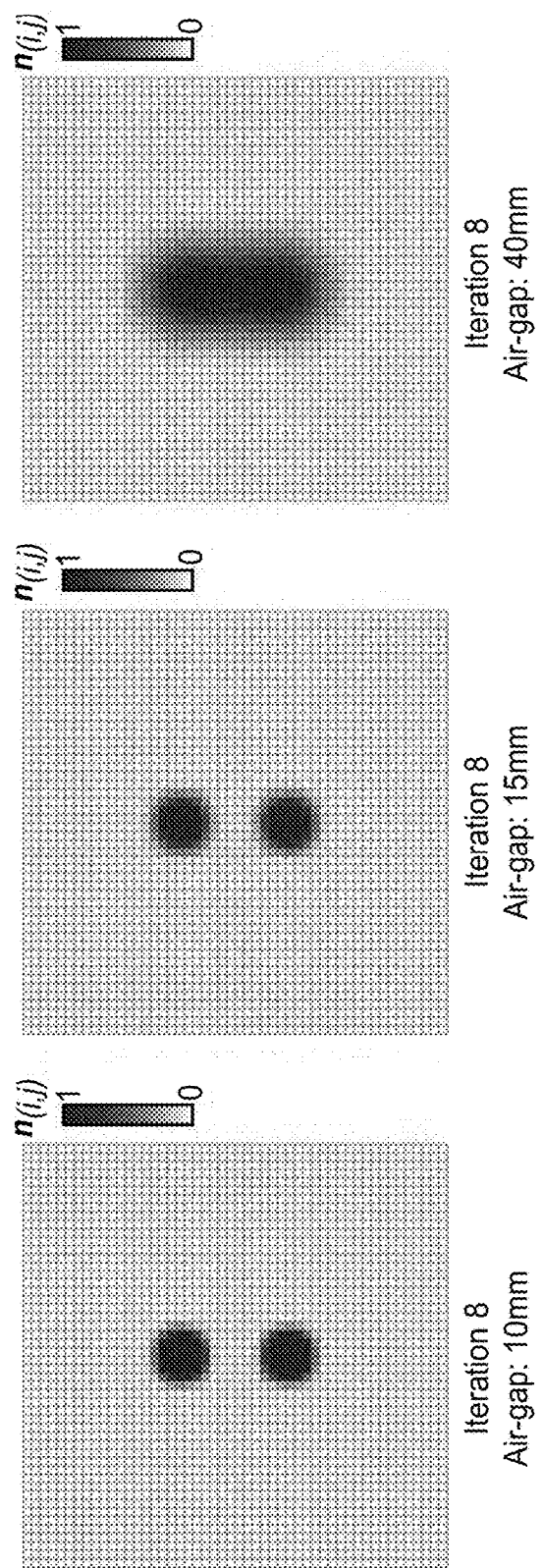

FIG. 10C shows a result obtained under three air-gap conditions. As illustrated in FIG. 10D, an optimal area may be determined according to iterations under the three air-gap conditions. That is, a layout of the secondary coil may be optimized.

FIGS. 11 and 12A to 12C are diagrams illustrating a procedure of determining a secondary coil, experiment setting, and a comparison between numerical and experimental results, according to an embodiment of the inventive concept.

Referring to FIGS. 11 and 12A to 12C, verification may be made through the experiment conducted with respect to air-gaps of 10 mm and 400 mm.

Figure 11:
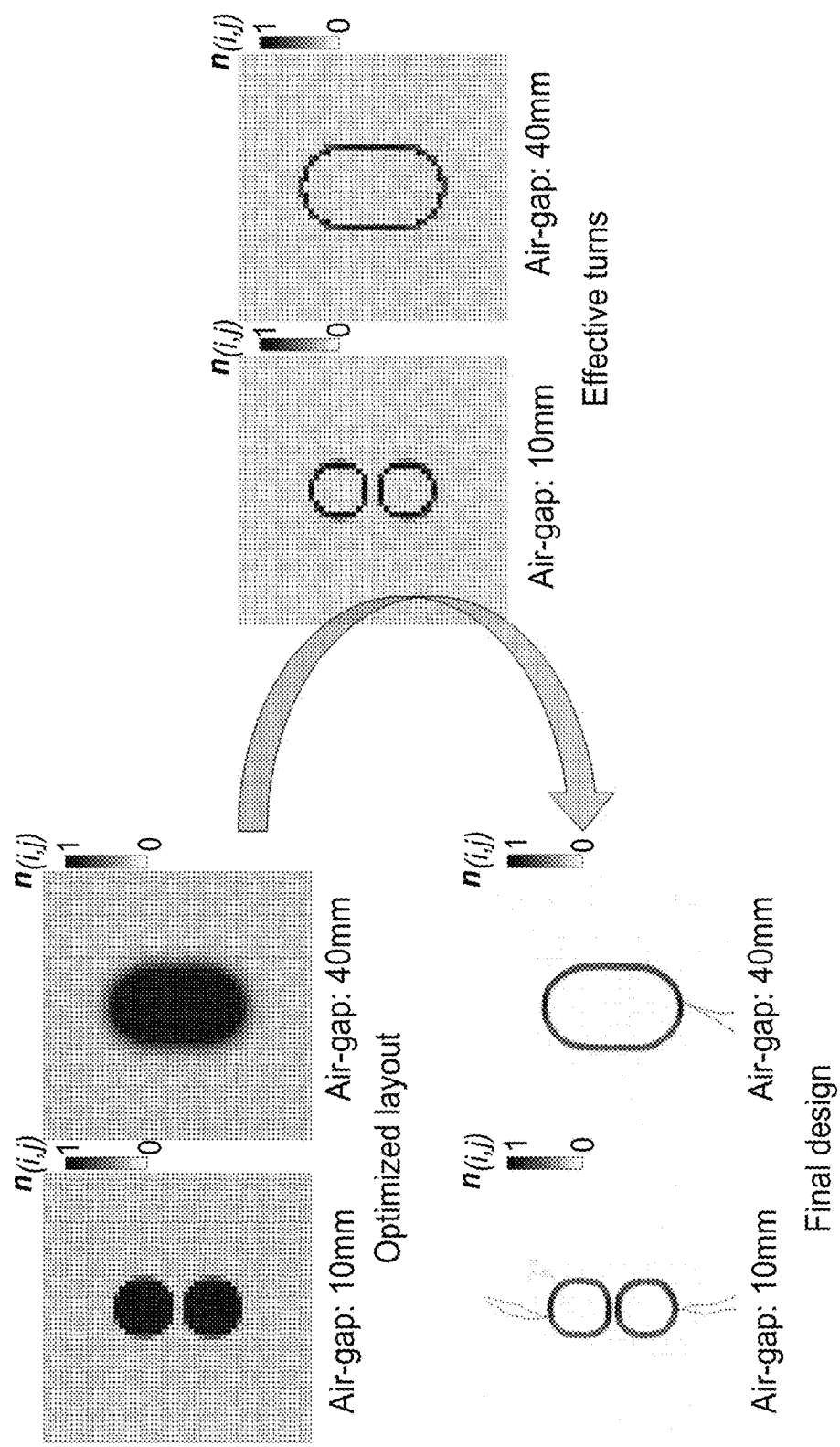
FIGS. 11 and 12A to 12C are diagrams illustrating a procedure of determining a secondary coil, experiment setting, and a comparison between numerical and experimental results, according to an embodiment of the inventive concept.

As illustrated in FIG. 11, physical coil shapes may be derived by post-processing optimized design results about two air-gaps 10 mm and 40 mm, and an experiment may be conducted under the same condition by applying the derived results to the optimized design. In other words, a design may be optimized under each air-gap condition. As effective turns are applied to the optimized designs, the inside of each optimized layout may be removed, and thus only an outer loop may remain. This may mean that a physical coil shape is finally derived.

Figure 12A:
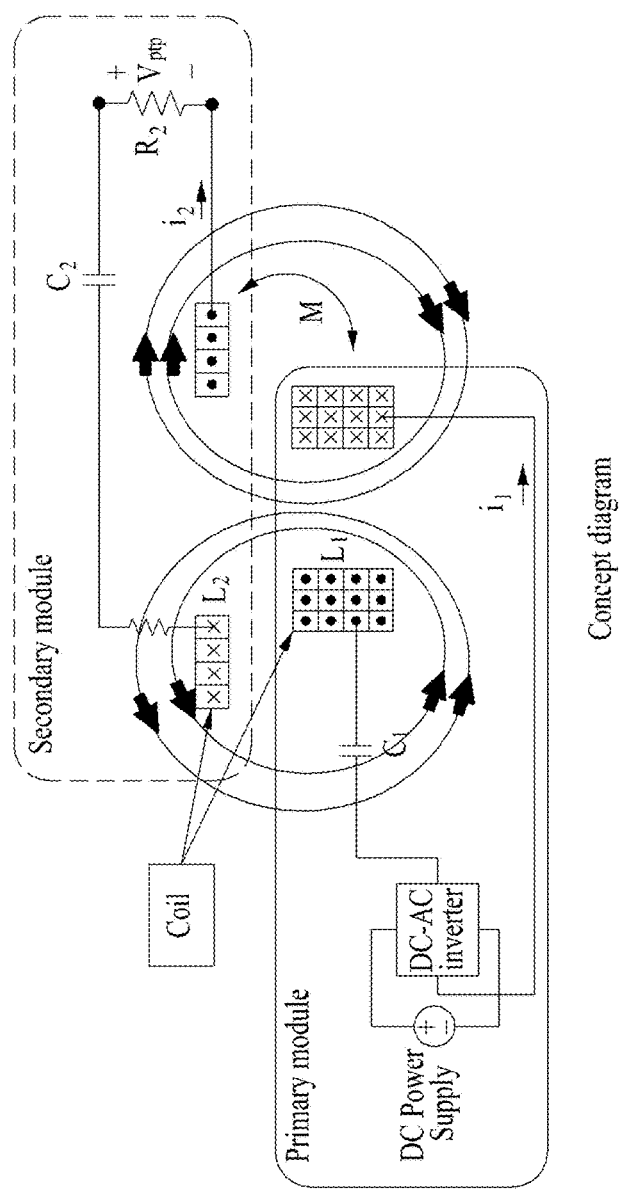
Figures 12B, 12C:
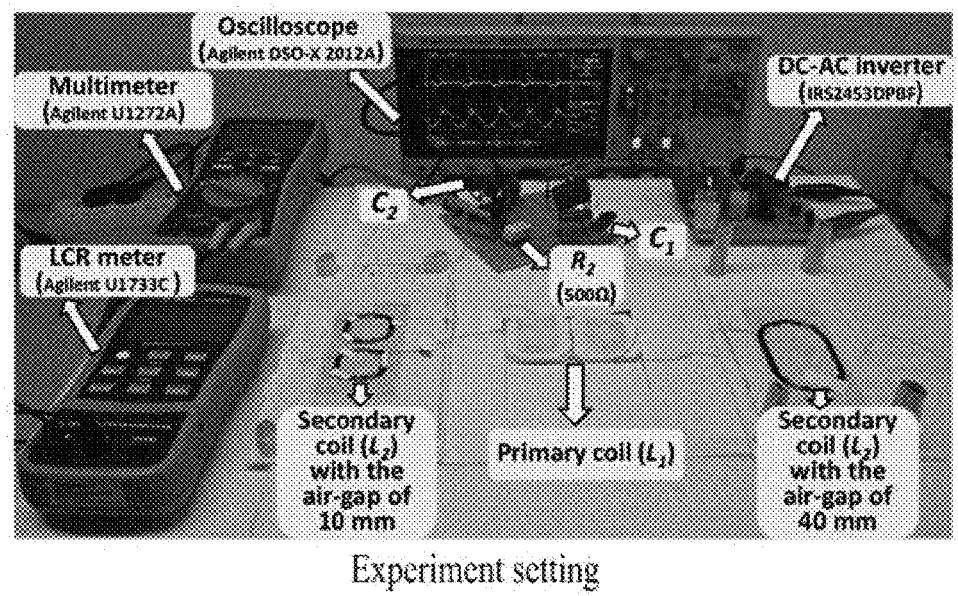

As illustrating in FIGS. 12A to 12C, an experiment circuit may be designed, and errors may be determined by comparing electromagnetic measures and physical measures of numerical and experimental results for each air-gap. As such, validity and effectiveness may be verified in consideration of errors between the numerical and experimental results.

Figure 13:
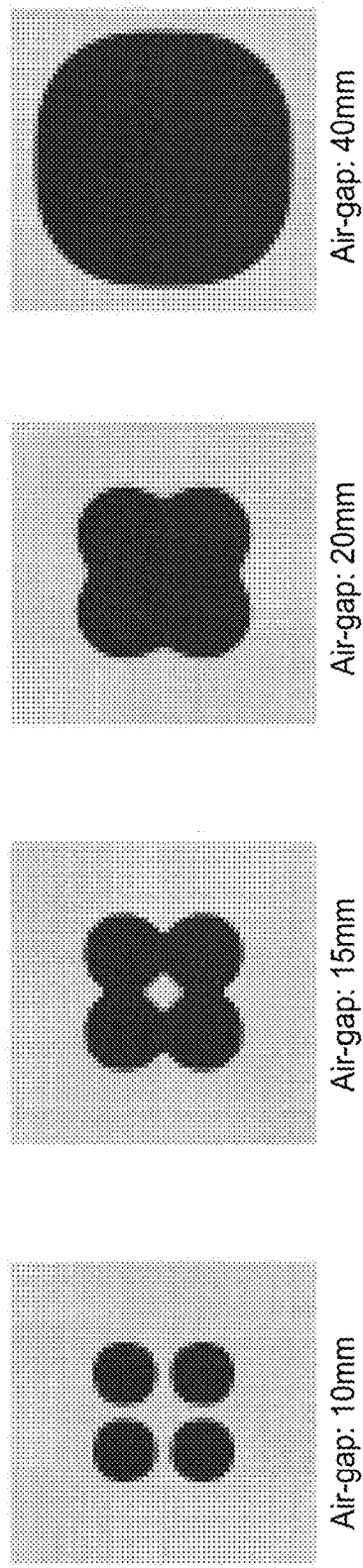
FIGS. 13 and 14 are diagrams illustrating layout results optimized according to an air-gap change when four primary coils exist, according to another embodiment of the inventive concept.
Figure 14:
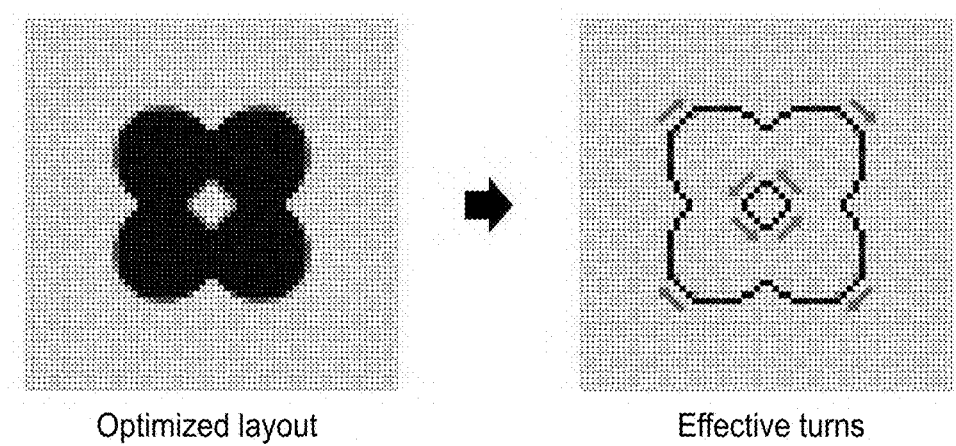

FIGS. 13 and 14 are diagrams illustrating layout results optimized according to an air-gap change when four primary coils exist, according to another embodiment of the inventive concept.

Referring to FIG. 13, there are illustrated layout results optimized according to an air-gap change when four primary coils exist.

Referring to FIG. 14, in the case where four primary coils exists, an equivalent closed loop may be obtained by applying effective turns to an optimized layout. Here, when a design is optimized, the inside of the optimized design may be removed, and thus an outer loop and an inner loop may remain. A physical coil shape may be derived from the outer and inner loops.

Embodiments of the inventive concept may provide a method for optimizing a coil layout of a wireless power transfer system based on two concepts: the fixed grid-based coil representation and the effective turns.

In addition, according to the embodiments of the inventive concept, it may be possible to derive an optimal coil layout which satisfies multiple constraints of a complicated wireless power transfer system including various design variables and optimizes (or minimizes) a given objective function. Thus, the performance of the wireless power transfer system may be maximized under a given condition.

In addition, in the case where robust optimization is additionally used, it may be possible to minimize an inductance change, which is caused according to a material characteristic change occurring due to misalignment and temperature change of a transceiver system, and instability of system due to the inductance change. Thus, the stability of the wireless power transfer system may be maximized.

Unlike a conventional design manner depending on experience and intuition of a designer, according to the embodiments of the inventive concept, since an optimal coil layout is determined based on optimization, the trial and error may be markedly reduced in developing a product. This may mean that a time and a cost needed to develop a product are reduced.

The optimization method and system according to embodiments of the inventive concept may be applied to a variety of applications ranging from electronics to electric vehicles, thereby making it possible to reinforce product competitiveness.

The units described herein may be implemented using hardware components, software components, or a combination thereof. For example, devices and components described therein may be implemented using one or more general-purpose or special purpose computers, such as, but not limited to, a processor, a controller, an arithmetic logic unit, a digital signal processor, a microcomputer, a field programmable gate array (FPGA), a programmable logic unit, a microprocessor or any other device capable of responding to and executing instructions in a defined manner. A processing device may run an operating system (OS) and one or more software applications that run on the OS. The processing device also may access, store, manipulate, process, and create data in response to execution of the software. For the sake of easy understanding, an embodiment of the inventive concept is exemplified as one processing device is used; however, one skilled in the art will appreciate that a processing device may include multiple processing elements and multiple types of processing elements. For example, a processing device may include multiple processors or a processor and a controller. In addition, different processing configurations are possible, such as parallel processors.

The software may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. In particular, the software and data may be stored by one or more computer readable recording mediums.

The example embodiments may be recorded in non-transitory computer-readable media including program instructions to perform various operations embodied by a computer. The media may also include, alone or in combination with the program instructions, data files, data structures, and the like. The media and program instructions may be those specially designed and constructed for the purposes, or they may be of the kind well-known and available to those having skill in the computer software arts. Examples of non-transitory computer-readable media include magnetic media such as hard disks, floppy disks, and magnetic tape; optical media such as CD ROM disks and DVD; magneto-optical media such as floptical disks; and hardware devices that specially store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be to act as one or more software modules in order to perform the operations of the above-described embodiments.

Accordingly, while exemplary embodiments of the inventive concept are susceptible to various modifications and alternative forms, specific embodiments thereof are shown by way of example in the drawings and will herein be described in detail. It should be understood, however, that there is no intent to limit exemplary embodiments of the inventive concept to the particular forms disclosed, but conversely, exemplary embodiments of the inventive concept are to cover all modifications, equivalents, and alternatives falling within the spirit and scope of the invention.

According to embodiments of the inventive concept, there may be provided secondary coil layout optimization method and system capable of determining an optimal secondary coil which satisfies all constraints (e.g., a mass, transfer capacity and efficiency, a criteria of health hazards, etc.) which a wireless power transfer system requires and optimizes a given performance value (e.g., an induced value, a mass, etc.).

In addition, there may be provided secondary coil layout optimization method and system capable of obtaining an actually available coil shape by post-processing a derived layout based on effective turns and smooth boundary representation.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for optimizing a layout of a secondary coil for a wireless power transfer, the method comprising:
   reconstructing, by one or more processors, a secondary coil based on a fixed grid, corresponding to a design domain, to set a relative turn of each fixed grid and obtaining at least one or more of an electromagnetic measure and a physical measure of the secondary coil to optimize a layout of the secondary coil;
   applying, by the one or more processors, an effective turn to the optimized layout of the secondary coil to perform post-processing;
   deriving, by the one or more processors, a layout of a physical coil about the secondary coil; and
   developing the secondary coil according to the derived layout,
   wherein the electromagnetic measure comprises at least one or more of a transfer efficiency, a transfer capacity, an induced voltage, and an electromagnetic field, and the physical measure comprises at least one or more of a mass, a volume, and a size of the secondary coil, and
   wherein the effective turn corresponds to one-half a sum of differences between the relative turns at a given position.

2. The method of claim 1, further comprising:
   obtaining an objective function for minimizing or maximizing at least one or more of the electromagnetic measure and the physical measure of the secondary coil.

3. The method of claim 1, further comprising:
   obtaining a constraint including at least one or more of an upper limit and a lower limit of the electromagnetic and physical measures of the secondary coil.

4. The method of claim 1, wherein the optimizing of the layout of the secondary coil comprises:
   form the fixed grid corresponding to the design domain;
   obtaining physical coil turns by reconstructing the secondary coil based on the fixed grids and setting the relative turn of each fixed grid; and
   obtaining the electromagnetic measure and the physical measure of the secondary coil to optimize the layout of the secondary coil.

5. The method of claim 1, wherein the optimizing of the layout of the secondary coil comprises:
   optimizing the layout of the secondary coil by calculating the physical measure of secondary coil through the effective turn and calculating the electromagnetic measure of the secondary coil through Maxwell equations.

6. The method of claim 1, wherein the applying of the effective turn to the optimized layout of the secondary coil to perform the post-processing comprises:
   applying the effective turn to the optimized layout of the secondary coil to calculate the physical measure of the secondary coil; and
   applying the effective turn to the optimized layout of the secondary coil to evaluate the electromagnetic measure of the secondary coil.

7. The method of claim 1, wherein the applying of the effective turn to the optimized layout of the secondary coil to perform the post-processing comprises:
   calculating smooth boundary representation to minimize a difference between fixed grid-based coil representation and physical coil implementation.

8. The method of claim 1, wherein the deriving comprises:
   post-processing the secondary coil composed of the fixed grid so as to have a coil having a smooth boundary; and
   calculating a physical characteristic value and an electromagnetic characteristic value of the secondary coil expressed with the smooth boundary.

9. A system for optimizing a layout of a secondary coil for a wireless power transfer, the system comprising:
   one or more processors; and
   a non-transitory computer-readable memory coupled to the one or more processors and storing instructions thereon executable by the one or more processors, the instructions including:

an optimization module reconstructing a secondary coil based on a fixed grid, corresponding to a design domain, to set a relative turn of each fixed grid and obtaining at least one or more of an electromagnetic measure and a physical measure of the secondary coil to optimize a layout of the secondary coil; and an analysis module applying an effective turn, corresponding to one-half a sum of differences between relative turns at a given position, to the optimized layout of the secondary coil to perform post-processing, wherein the electromagnetic measure comprises at least one or more of a transfer efficiency, a transfer capacity, an induced voltage, and an electromagnetic field, and the physical measure comprises at least one or more of a mass, a volume, and a size of the secondary coil, wherein the optimization module derives a layout of a physical layout about the secondary coil by analyzing at least one or more of the electromagnetic measure and the physical measure of the secondary coil based on a result of the post-processing received from the analysis module, and wherein the secondary coil is developed according to the derived layout.

10. The system of claim 9, wherein the optimization module comprises:

an object function setting unit obtaining an objective function for minimizing or maximizing at least one or more of the electromagnetic measure and the physical measure of the secondary coil.

11. The system of claim 9, wherein the optimization module comprises:

a constraint setting unit obtaining a constraint including at least one or more of an upper limit and a lower limit of the electromagnetic and physical measures of the secondary coil.

12. The system of claim 9, wherein the optimization module comprises:

a fixed grid generation unit forming the fixed grid corresponding to the design domain;

a relative turn setting unit obtaining physical coil turns by reconstructing the secondary coil based on the fixed grids and setting the relative turn of each fixed grid; and a layout unit obtaining the electromagnetic measure and the physical measure of the secondary coil to optimize the layout of the secondary coil.

13. The system of claim 9, wherein the optimization module optimizes the layout of the secondary coil by calculating the physical measure of secondary coil through the effective turn and calculating the electromagnetic measure of the secondary coil through Maxwell equations.

14. The system of claim 9, wherein the analysis module comprises:

a physical measure evaluation unit applying the effective turn to the optimized layout of the secondary coil to calculate the physical measure of the secondary coil; and an electromagnetic measure evaluation unit applying the effective turn to the optimized layout of the secondary coil to evaluate the electromagnetic measure of the secondary coil.

15. The system of claim 14, wherein the electromagnetic measure evaluation unit represents an equivalent closed loop based on the post-processing to calculate the electromagnetic measure.

* * * * *